Figure 1:
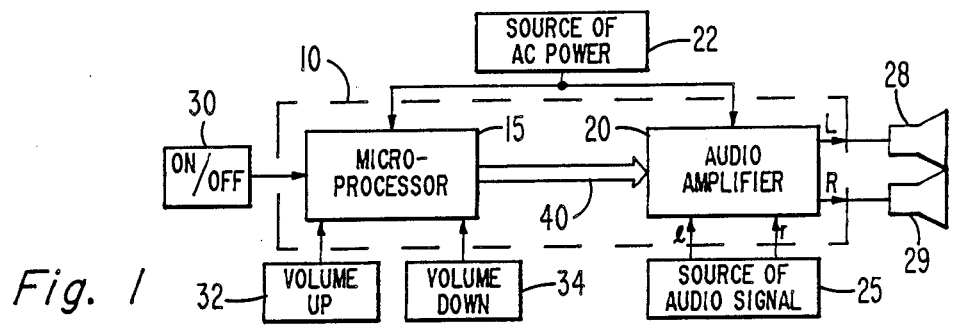

United States Patent [19]

Beyers, Jr.

[11] Patent Number: 4,792,990
[45] Date of Patent: Dec. 20, 1988

[54] AUDIO AMPLIFIER WITH PROGRAMMED VOLUME CONTROL

[75] Inventor: Billy W. Beyers, Jr., Greenfield, Ind.

[73] Assignee: RCA Licensing Corporation, Princeton, N.J.

[21] Appl. No.: 19,856

[22] Filed: Feb. 27, 1987

[51] Int. Cl.⁴ .............................................. H03G 3/00
[52] U.S. Cl. .................................. 455/234; 455/217; 455/232; 381/107
[58] Field of Search ............... 455/234, 254, 293, 221, 455/232, 217, 341, 343; 358/198; 381/107, 28, 59, 56; 330/51, 135

[56] References Cited

U.S. PATENT DOCUMENTS

| | | | |
|---|---|---|---|
| 3,873,921 | 3/1975 | Petrinec | 455/232 |
| 3,953,801 | 4/1976 | Podowski . | |
| 4,158,814 | 6/1979 | Imazeki et al. | 455/234 |
| 4,313,213 | 1/1982 | Farina et al. | 455/158 |
| 4,454,608 | 6/1984 | Maeba | 381/107 |
| 4,495,652 | 1/1985 | Leslie | 455/234 |
| 4,553,257 | 11/1985 | Mori et al. | 381/107 |
| 4,718,114 | 1/1988 | Brandt | 455/217 |

FOREIGN PATENT DOCUMENTS

| | | | |
|---|---|---|---|
| 0033327 | 2/1983 | Japan | 455/234 |
| 0189734 | 8/1986 | Japan | 455/234 |

Primary Examiner—Robert L. Griffin
Assistant Examiner—Curtis A. Kuntz
Attorney, Agent, or Firm—Paul J. Rasmussen; Peter M. Emanuel; Ronald H. Kurdyla

[57] ABSTRACT

In a programmed audio amplifier system, the volume setting when the system is turned on is conditionally related to the last volume setting, i.e., immediately before the amplifier was turned off. At turn-on the system remains at the last volume setting as long as it is less than a preset volume setting. However, at turn-on the system exhibits the preset volume setting if the last volume setting exceeds the preset volume setting.

1 Claim, 1 Drawing Sheet

4,792,990

AUDIO AMPLIFIER WITH PROGRAMMED VOLUME CONTROL

This invention concerns apparatus for establishing the gain/volume setting of an audio amplifier at turn-on.

It often happens that an audio power amplifier is turned off after having been operated at a high volume (signal gain) setting for one type of audio source material, and is afterwards turned on again when different source material is being used. In the latter case the sound level of the reproduced source material may be excessive, resulting in listener distress or damage to sound reproducing loudspeakers of the system.

In the case of a programmable audio system, one solution to this problem is to program the system so that the amplifier always exhibits a factory preset volume setting when the amplifier is turned on. The preset volume setting is typically fixed at about mid-range during manufacture of the system. It is herein recognized, however, that such a preset volume setting may be inappropriate for one reason or another, such as different listener preferences or different listening environments.

Accordingly, pursuant to the principles of the present invention there is disclosed herein a programmed audio amplifier system wherein the volume level when the system is turned on is conditionally related to the last previous volume setting, i.e., to the volume setting when the system was last turned off. In a disclosed preferred embodiment of the invention, at turn-on the system exhibits the last volume setting if the last volume setting is less than the factory preset volume setting. However, at turn-on the system exhibits the preset volume level if the last volume setting exceeds the preset volume level.

Figure 2:
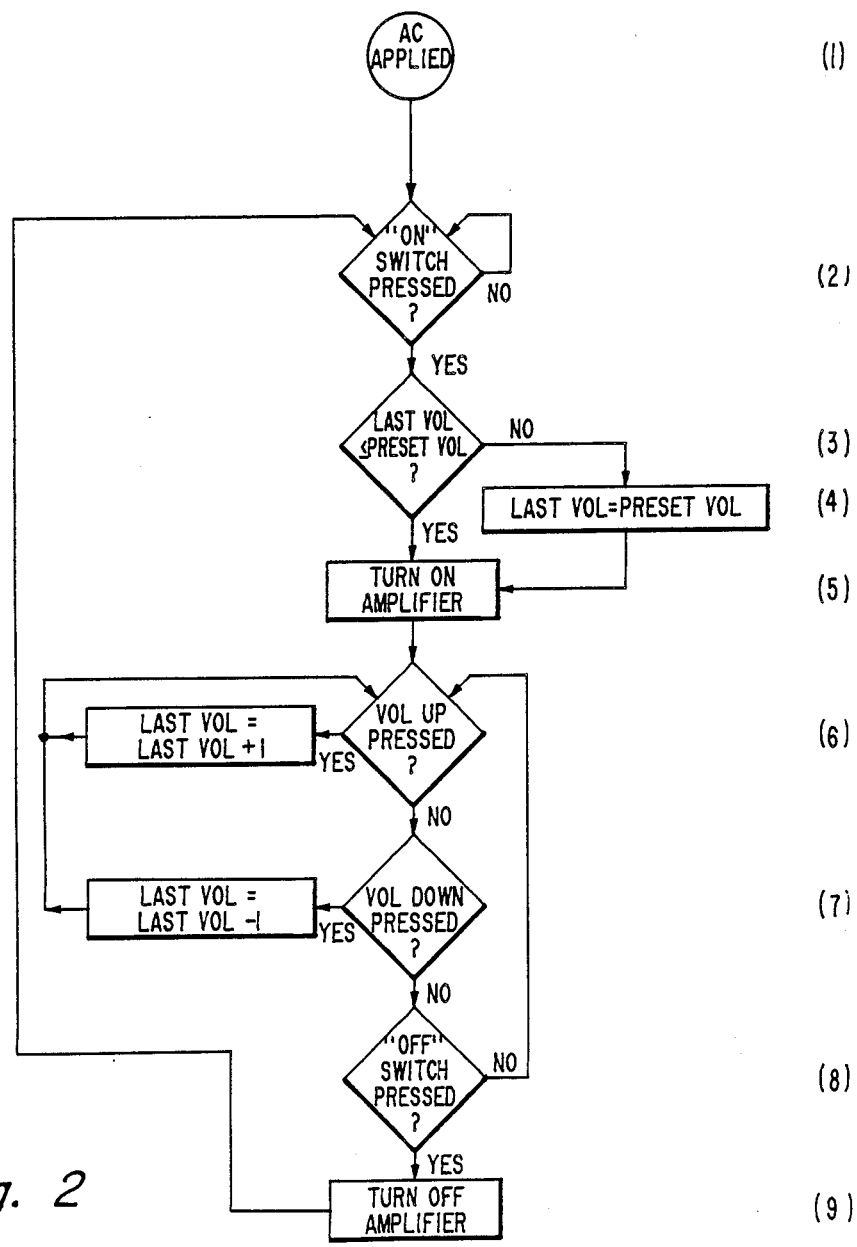

In the drawing:

FIG. 1 is a block diagram of a programmable audio amplifier system suited to employing the principles of the present invention; and FIG. 2 illustrates a flow chart of an audio amplifier volume programming process in accordance with the principles of the present invention.

In FIG. 1, a programmed audio amplifier system 10 includes a microprocessor 15 and an audio amplifier 20 controlled by microprocessor 15, each with associated energizing power supplies (not shown) coupled to a source of AC power 22 such as household AC power. Amplifier 20 receives low level stereophonic audio signals 1 (left) and r (right) from a source 25. Amplified L and R output signals from amplifier 25 are provided to respective sound reproducing loudspeakers 28 and 29.

Microprocessor 15 receives control signal inputs from a user operated system ON/OFF control network 30 e.g., an on-off switch or keying device, and a user operated VOLUME UP control 32 and a VOLUME DOWN control 34. Controls 32 and 34 comprise, for example, viewer operated push-button switches for incrementing or decrementing the volume level of reproduced sound in fixed amounts, e.g., in 1 db steps.

Plural outputs 40 of microprocessor 15, e.g., in binary form, are coupled to a control input of amplifier 20 for turning on and turning off amplifier 20. In this regard amplifier 20 includes a digital-to-analog converter network responsive to the binary signals. Outputs 40 also are coupled to a volume control input of amplifier 20 for controlling the signal gain of amplifier 20 and therefore the magnitude of the audio signals processed by amplifier 20, to thereby control the volume of reproduced sound information. Specifically, in accordance with the principles of the present invention, control signals 40 from microprocessor 15 control the gain/volume setting of amplifier 20 as a function of the last gain setting. When the system including amplifier 20 is turned on (i.e., when the power supply of microprocessor 15 is enabled via switch 30 and when the power supply of amplifier 20 is enabled via output signals 40 from microprocessor 15), amplifier 20 exhibits the last volume setting if the last volume setting is less than a predetermined factory preset volume setting. However, at turn-on amplifier 20 exhibits the factory preset volume setting if the last volume setting exceeds the preset setting. The preset volume setting is established by means of a reference value stored in a non-volatile memory, such as a PROM (programmable read only memory), associated with microprocessor 15.

FIG. 2 illustrates a flow chart of the process by which the aforementioned turn-on gain/volume setting is established.

In FIG. 2, AC power is applied to the system in step (1), such as by plugging the system power receptacle into a household AC wall outlet. At this point certain operating functions within microprocessor 15 are reset. In the decision block of step (2) it is determined whether or not the ON switch has been pressed (i.e., whether switch 30 of FIG. 1 has been placed in the "ON" position). If not, this inquiry is repeated until switch 30 is placed in the "ON" position. Once it has been determined that switch 30 is in the "ON⇌" position, it is determined from the decision block of step (3) whether or not the stored value for the last volume setting (LAST VOL) is less than or equal to, or greater than, the preset volume value (PRESET VOL).

If the last volume setting LAST VOL is greater than the preset volume value PRESET VOL, last volume setting LAST VOL is reassigned a new value, the preset volume value, as indicated by step (4). The last volume value remains unchanged if the last volume setting is less than or equal to the preset volume value. Amplifier 20 is turned on (step 5) after the value of the last volume setting has been established. Thus when amplifier 20 is turned on, it will exhibit a gain/volume setting equal either to the preset volume setting if such last volume setting is greater than the preset volume setting, or to the actual last volume setting if such last volume setting is less than or equal to the preset volume setting, and loudspeakers 28 and 29 will reproduce sound information with an intensity related to such volume setting.

Steps (6) and (7) of the flow chart concern the process by which the gain of amplifier 20, and thereby sound volume, are changed in response to viewer adjustment of volume controls 32 and 34 in FIG. 1. As seen from steps (6) and (7), the LAST VOL value will be incremented as in step (6) or decremented as in step (7) depending upon which of volume controls 32 and 34 is being used at a given time. When neither volume control 32 nor volume control 34 is being used, it is determined via the decision block of step (8) whether or not ON/OFF switch 30 has been placed in the OFF position. If not, the volume status is continually checked and updated as required by repeating steps (6) and (7). If switch 30 hss been placed in the OFF position, amplffier 20 is turned off as indicated by step (9). The control process is completed by returning to the decision block of step (2) to determine if the amplifier should remain off (NO output) or if the amplifier turn-on and volume control procedure should commence (YES output).

What is claimed is:

1. An audio signal processing system comprising:

memory means for storing a signal representative of a gain for determining the volume of reproduced sound information;

an audio amplifier having a signal input for receiving an audio signal containing sound information to be reproduced, a signal output for providing an amplified audio signal to sound reproducing means, and a controllable signal gain for determining the volume of reproduced sound information, in response to a first stored gain corresponding to a first signal level of said amplified audio signal immediately prior to said amplifier being deactivated and a subsequent second gain corresponding to a second signal level of said amplified audio signal immediately prior to said amplifier being reactivated; and control means for providing a control signal to said audio amplifier for automatically controlling said signal gain and thereby said volume so that, when said amplifier is reactivated, wherein to prevent said system from developing an excessive volume level said control signal automatically causes said second gain to be substantially equal to said first gain if said first gain is less than a predetermined preset gain value; and said control signal automatically causes said second gain to be substantially equal to said predetermined preset gain value, if said first gain is greater than said predetermined preset gain value.

* * * * *